(12) United States Patent
Yang et al.

(10) Patent No.: US 11,985,905 B2
(45) Date of Patent: May 14, 2024

(54) HIGHLY PHYSICAL ION RESISTIVE SPACER TO DEFINE CHEMICAL DAMAGE FREE SUB 60NM MRAM DEVICES

(71) Applicant: Taiwan Semiconductor Manufacturing Company, Ltd., Hsin-Chu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/158,086

(22) Filed: Jan. 23, 2023

(65) Prior Publication Data

US 2023/0165157 A1     May 25, 2023

Related U.S. Application Data

(60) Continuation of application No. 17/216,016, filed on Mar. 29, 2021, now Pat. No. 11,563,171, which is a division of application No. 15/986,244, filed on May 22, 2018, now Pat. No. 10,964,887.

(51) Int. Cl.
| | | |
|---|---|---|
| *H10N 50/10* | (2023.01) |
| *G11C 11/16* | (2006.01) |
| *H01F 10/32* | (2006.01) |
| *H01F 41/34* | (2006.01) |
| *H10N 50/01* | (2023.01) |
| *H10N 50/80* | (2023.01) |
| *H01F 41/30* | (2006.01) |

(52) U.S. Cl.
CPC .......... *H10N 50/01* (2023.02); *G11C 11/161* (2013.01); *H01F 10/3254* (2013.01); *H01F 41/34* (2013.01); *H10N 50/10* (2023.02); *H10N 50/80* (2023.02)

(58) Field of Classification Search
CPC ....... G11C 11/161; H01L 43/08; H01F 41/34; H10N 50/10
See application file for complete search history.

(56) References Cited

U.S. PATENT DOCUMENTS

| | | |
|---|---|---|
| 9,087,981 B2 | 7/2015 | Hsu et al. |
| 9,406,876 B2 | 8/2016 | Pinarbasi |
| 9,728,718 B2 | 8/2017 | Machkaoustan et al. |

(Continued)

*Primary Examiner* — Antonio B Crite
(74) *Attorney, Agent, or Firm* — Haynes and Boone, LLP

(57) ABSTRACT

A magnetic tunneling junction (MTJ) structure comprises a pinned layer on a bottom electrode. a barrier layer on the pinned layer, wherein a second metal re-deposition layer is on sidewalls of the barrier layer and the pinned layer, a free layer on the barrier layer wherein the free layer has a first width smaller than a second width of the pinned layer, a top electrode on the free layer having a same first width as the free layer wherein a first metal re-deposition layer is on sidewalls of the free layer and top electrode, and dielectric spacers on sidewalls of the free layer and top electrode covering the first metal re-deposition layer wherein the free layer and the top electrode together with the dielectric spacers have a same the second width as the pinned layer wherein the dielectric spacers prevent shorting between the first and second metal re-deposition layers.

20 Claims, 2 Drawing Sheets

(56) References Cited

U.S. PATENT DOCUMENTS

| | | |
|---|---|---|
| 2011/0235217 A1 | 9/2011 | Chen et al. |
| 2015/0255507 A1 | 9/2015 | Pakala et al. |
| 2015/0340593 A1 | 11/2015 | Lu et al. |
| 2017/0084828 A1 | 3/2017 | Hsu |
| 2018/0248116 A1 | 8/2018 | Doczy et al. |
| 2019/0103554 A1* | 4/2019 | Aggarwal .............. H10B 61/00 |
| 2019/0341090 A1 | 11/2019 | Annunziata et al. |
| 2019/0363249 A1 | 11/2019 | Yang et al. |
| 2021/0217951 A1 | 7/2021 | Yang et al. |

* cited by examiner

HIGHLY PHYSICAL ION RESISTIVE SPACER TO DEFINE CHEMICAL DAMAGE FREE SUB 60NM MRAM DEVICES

PRIORITY DATA

The present application is a continuation application of U.S. patent application Ser. No. 17/216,016, filed Mar. 29, 2021, which is a divisional application of U.S. patent application Ser. No. 15/986,244, filed May 22, 2018, each of which is incorporated herein by reference in its entirety.

TECHNICAL FIELD

This application relates to the general field of magnetic tunneling junctions (MTJ) and, more particularly, to methods for preventing shorts and sidewall damage in the fabrication of sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance. To solve this issue, pure physical etching techniques such as pure Ar RIE or ion beam etching (IBE) have been applied to etch the MTJ stack. However, due to the non-volatile nature, pure physically etched conductive materials in the MTJ and bottom electrode can form a continuous path across the tunnel barrier, resulting in shorted devices. A new approach to remove these two kinds of sidewall damage is thus needed for the future sub 60 nm MRAM products.

Several patents teach two-step methods of etching MTJ stacks, including U.S. Pat. No. 9,087,981 (Hsu et al), U.S. Pat. No. 9,406,876 (Pinarasi), and U.S. Pat. No. 9,728,718 (Machkaoutsan et al), but these methods are different from the present disclosure.

SUMMARY

It is an object of the present disclosure to provide a method of forming MTJ structures without chemical damage on the MTJ sidewalls or shorting of MTJ devices.

Another object of the present disclosure is to provide a method of forming MTJ structures having chemical damage free MTJ sidewalls and eliminating conductive metal re-deposition induced shorted devices.

Another object of the present disclosure is to provide a method of forming MTJ structures having chemical damage free MTJ sidewalls and eliminating conductive metal re-deposition induced shorted devices using a spacer assisted pure physical etch.

In accordance with the objectives of the present disclosure, a method for fabricating a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and the free layer not covered by the hard mask are etched, stopping at or within the barrier layer. Thereafter, the hard mask, top electrode layer, and free layer are encapsulated with an encapsulation layer. A spacer layer is deposited over the encapsulation layer and the spacer layer is etched away on horizontal surfaces leaving spacers on sidewalls of the encapsulation layer wherein sidewalls of the free layer are covered by a combination of the encapsulation layer and spacers. Thereafter, the barrier layer and pinned layer are etched to complete formation of the MTJ structure.

Also in accordance with the objectives of the present disclosure, a magnetic tunneling junction (MTJ) structure comprises a pinned layer on a bottom electrode. a barrier layer on the pinned layer, wherein a second metal re-deposition layer is on sidewalls of the barrier layer and the pinned layer, a free layer on the barrier layer wherein the free layer has a first width smaller than a second width of the pinned layer, a top electrode on the free layer having a same first width as the free layer wherein a first metal re-deposition layer is on sidewalls of the free layer and top electrode, and dielectric spacers on sidewalls of the free layer and top electrode covering the first metal re-deposition layer wherein the free layer and the top electrode together with the dielectric spacers have a same second width as the pinned layer wherein the dielectric spacers prevent shorting between the first and second metal re-deposition layers.

BRIEF DESCRIPTION OF THE DRAWINGS

In the accompanying drawings forming a material part of this description, there is shown.

DETAILED DESCRIPTION

In the present disclosure, a spacer assisted pure physical etch can create chemical damage free MTJ sidewalls and also eliminate conductive metal re-deposition induced shorted devices. More specifically, the free layer is physically etched by pure Ar RIE or IBE, then covered by a spacer. Next, the pinned layer is physically etched using the spacer as a hard mask. The spacer material can be made of carbon or TaC, which is highly resistant to this type of etch, thus ensuring that enough of the spacer remains to protect the free and barrier layers. This method is particularly useful for high density sub 60 nm MRAM devices, where chemical damage and re-deposition on the MTJ sidewall become very severe for these smaller MRAM chips.

In a typical MRAM fabrication process, the whole MTJ stack consisting of free, barrier, and pinned layers is patterned by one single step etch, either by chemical RIE or physical IBE. It therefore creates either chemical damage or physical shorts on the MTJ sidewall. However, in the process of the present disclosure, we firstly etch the free layer by pure Ar RIE or IBE, cover it with a highly physical etch resistant spacer, and then etch the pinned layer by pure Ar RIE or IBE using the spacer as a hard mask. By this method, both issues are solved simultaneously, greatly enhancing the device performance.

Figure 1:
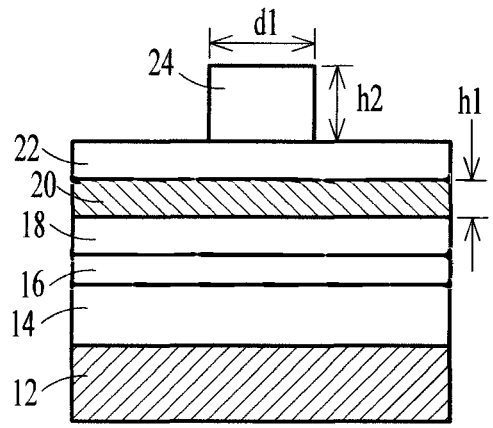
FIGS. 1 through 8 illustrate in cross-sectional representation steps in a preferred embodiment of the present disclosure.

The preferred embodiment of the present disclosure will be described in more detail with reference to FIGS. 1-8. FIG. 1 illustrates a bottom electrode layer 12 formed on a semiconductor substrate, not shown. Now, the MTJ stack, comprising at least a pinned layer 14, a tunnel barrier layer 16, and a free layer 18, are deposited on the bottom electrode. A top electrode 20 comprising Ta, TaN, Ti, TiN, W, Cu, Mg, Ru, Cr, Co, Fe, Ni or their alloys is deposited over the MTJ stack to a thickness h1 of 10-100 nm, and preferably 50 nm. A dielectric hard mask 22 of $SiO_2$, SiN, SiON, SiC or SiCN is deposited on the top electrode to a thickness of 20 nm. Finally a photoresist mask 24 is formed over the hard mask 20 forming pillar patterns with size d1 of approximately 70-80 nm and height h2 of 200 nm.

Figure 2:
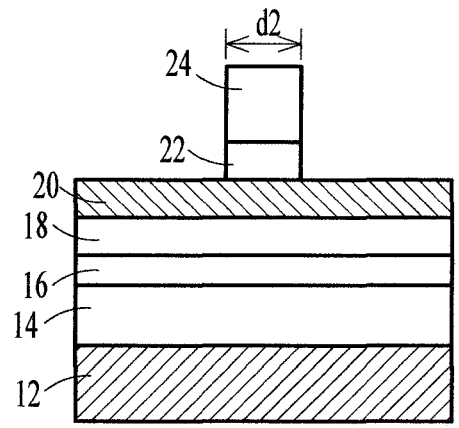

Now, as shown in FIG. 2, the hard mask 22 is etched by a fluorine carbon based plasma such as $CF_4$ or $CHF_3$ alone, or mixed with Ar and $N_2$. $O_2$ can be added to reduce the pillar size further to d2 of about 50-60 nm.

Figure 3:
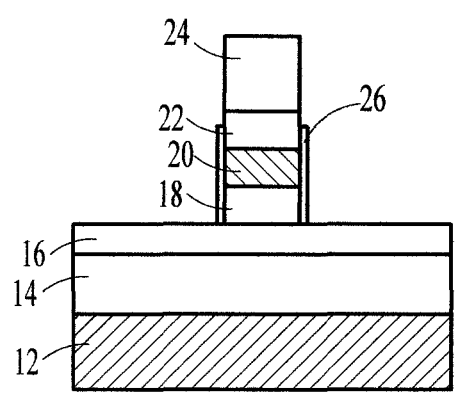

Next the top electrode is etched by RIE or IBE, followed by a pure Ar RIE or IBE etch of the free layer. If RIE is used to etch the top electrode, the top electrode and free layer etching must be in separate steps since RIE causes chemical damages and cannot be applied to the free layer. If IBE is used, the top electrode and free layer can be etched by one single etch step using the same recipe. The free layer etch step can stop at the interface between the free layer 18 and the tunneling barrier 16 or within the tunneling barrier. Because of the nature of a physical etch, there is no chemical damage after this etching step, but only a thin layer of conductive metal re-deposition 26 on the free layer's sidewall, as shown in FIG. 3.

Figure 4:
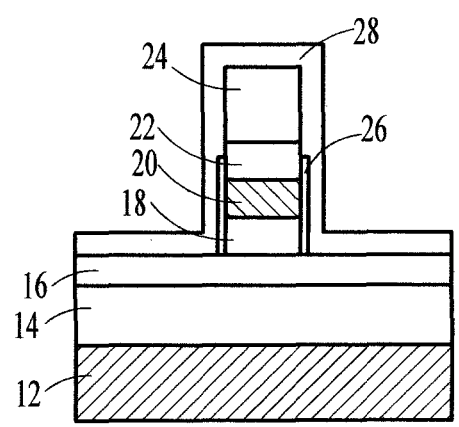

The photoresist 24 is stripped away by oxygen alone or mixed with $N_2$ or $H_2O$. Then, as illustrated in FIG. 4, an encapsulation layer 28, made of $Al_2O_3$, SiON, or SiN, is deposited over the partially etched MTJ stack and the bottom electrode by chemical vapor deposition (CVD), physical vapor deposition (PVD), or atomic layer deposition (ALD) to a thickness of 5-30 nm. The deposition may be either in-situ or ex-situ. This non-conductive encapsulation layer will protect the free layer from shorting by encapsulating the conductive metal re-deposition 26.

Figure 5:
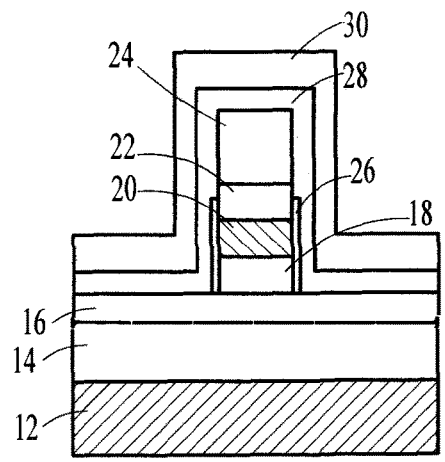

Now, as shown in FIG. 5, a spacer material layer 30 is deposited over the encapsulation layer 28. The spacer material 30 is carbon, TaC, or Al which has a very low etch rate under physical etching. The spacer material layer 30 is deposited in-situ or ex-situ by CVD, PVD, or ALD to a thickness of 10-30 nm.

Figure 6:
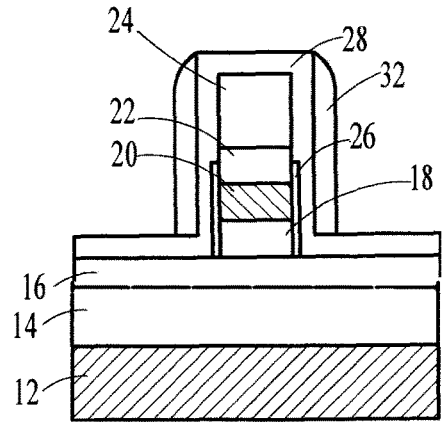

Next the portion of the spacer layer 30 that is on horizontal surfaces is etched away by RIE, leaving spacers 32 having a thickness of 5-20 nm only on the sidewalls of the pattern, as shown in FIG. 6. Dependent on the material that is used for the spacer, different plasmas can be used for this step. For example, $O_2$ can be applied for carbon, fluorine carbon such as $CF_4$ or a Halogen such as $Cl_2$ can be used for TaC, and a Halogen such as $Cl_2$ can be used for Al.

Figure 7:
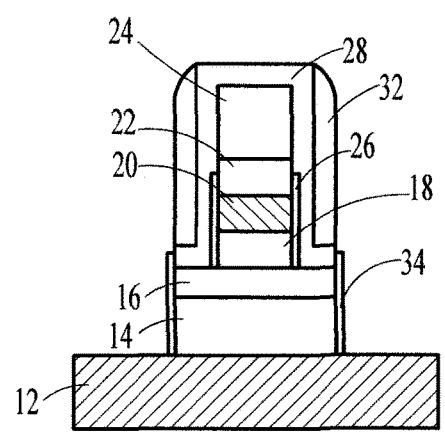

Referring to FIG. 7, using the spacer 32 left on the encapsulated free layer sidewall as a self-aligned hard mask, the barrier layer 16 and pinned layer 14 are etched by the same type of physical etch as was used to etch the free layer. By doing this, one can again avoid forming any chemical damage layer but only generate a thin layer of conductive metal re-deposition 34 on the pinned layer's sidewall. Since the pinned layer is thin, the re-deposition from it would not cover the whole spacer but at most the bottom portion of the spacer 32. Here it should be noted that, as shown in Table 1, carbon's IBE etch rate is only ~60 A/s, much lower than those commonly used metals in the MTJ hard mask and stack, which are usually larger than 200 A/s. That is, the spacer's etch rate would be ⅓ the etch rate of the pinned layer. Therefore after this etch step, enough of the spacer 32, ≤1 nm, would remain to protect the encapsulated free layer.

TABLE 1

Summary of various materials' IBE etch rate in Angstroms/minute
(from http://www.microfabnh.com/ion_beam_etch_rates.php)

| Material | Etch Rate (A/min) |
|---|---|
| Ag | 1050 |
| Al | 48 |
| Au | 630 |
| AZ 1350 | 117 |
| C | 64 |
| CdS | 1283 |
| Co | 262 |
| Cr | 309 |
| Cu | 513 |
| Fe | 204 |
| Si | 216 |
| SiC | 204 |
| SiO2 | 192 |
| Hf | 385 |
| InSb | 887 |
| Ir | 344 |
| Ge | 537 |
| Mg | 131 |
| Mn | 507 |
| Mo2C | 163 |
| Nb | 274 |
| Ni | 309 |
| NiCr | 309 |
| Pb | 1517 |
| PbTe | 2199 |
| Pd | 642 |
| Rb | 2333 |
| Re | 303 |
| Rh | 420 |
| Riston 14 | 146 |
| Ru | 356 |
| Sb | 1889 |
| Ni80Fe2O | 292 |
| Ni | 309 |
| Zr | 332 |
| Ta | 245 |
| Ta2O5 | 350 |
| TaC | 87 |
| TaN | 233 |
| Ti | 192 |
| Ti or TiW | 195 |
| W | 198 |
| Y | 554 |
| Zr | 332 |

The re-deposition from the free and pinned layer etches, 26 and 34, respectively, are separated by the encapsulation 28 and spacer 32 materials, without forming a continuous path to short the devices. This approach is of particular use for sub 60 nm MRAM devices where the spacer has to be thin enough to maintain the pattern geometry for the self-aligned etch, but still be capable of protecting the previously defined free layer. Another benefit of this spacer etch is that the pinned layer has a larger volume than the free layer, about 50-60 nm for the pinned layer and about 40-50 nm for the free layer, so that the pinned layer has strong enough pinning strength to stabilize the magnetic state in the free layer.

Figure 8:
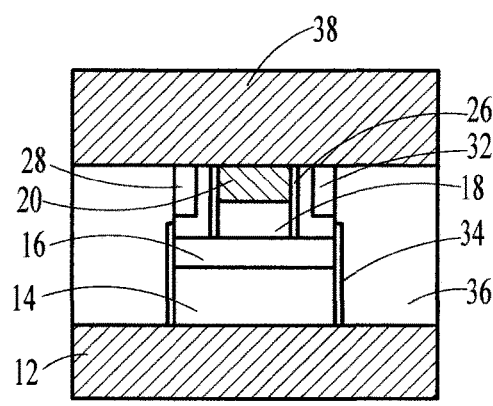

After the pinned layer etch, the whole device can be filled with dielectric material 36 and flattened by chemical mechanical polishing (CMP) to expose the top electrode 20, as shown in FIG. 8. The remaining spacer 32 on the sidewall can stay within the structure without affecting the device integrity and device performance. A top metal contact 38 contacts the top electrode 20.

The process of the present disclosure employs a physical etch to eliminate chemical damage on the MTJ sidewall and prevents the conductive re-deposition from shorting the devices. It has been considered to be difficult to achieve these two results simultaneously, but the process of the present disclosure provides these results.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A device comprising:
a stack of magnetic tunneling junction (MTJ) layers, the stack of MTJ layers including a first portion having a first width and a second portion having a second width that is different than the first width, the second portion disposed over the first portion of the stack of MTJ layers;
a first metal re-deposition layer disposed directly on a surface of the first portion of the stack of MTJ layers;
a second metal re-deposition layer disposed directly on a surface of the second portion of the stack of MTJ layers;
a dielectric layer extending from the second metal re-deposition layer to the first metal re-deposition layer; and
a spacer disposed directly on the dielectric layer.

2. The device of claim 1, wherein the dielectric layer is disposed between the spacer and the first and second metal re-deposition layers thereby preventing the spacer from interfacing with either of the first and second metal re-deposition layers.

3. The device of claim 1, further comprising a metal contact interfacing with the spacer, the dielectric layer, the second metal re-deposition layer and the second portion of the stack of MTJ layers.

4. The device of claim 1, wherein the spacer includes a carbon containing material.

5. The device of claim 1, wherein the dielectric layer is formed of the same material throughout the dielectric layer and physically contacts the first and second metal re-deposition layers.

6. The device of claim 1, wherein the first portion of the stack of MTJ layers includes a pinned layer and tunnel barrier layer, and
wherein the second portion of the stack of MTJ layers includes a free layer and a first electrode layer.

7. The device of claim 6, wherein the first metal re-deposition layer is disposed directly on the pinned layer and the tunnel barrier layer, and
wherein the second metal re-deposition layer is disposed directly on the free layer and the first electrode layer.

8. The device of claim 6, further comprising a second electrode layer, and
wherein the second electrode layer has a third width that is different than the first and second widths.

9. A device comprising:
a stack of magnetic tunneling junction (MTJ) layers, the stack of MTJ layers including a first portion and a second portion;
a first metal re-deposition layer disposed directly on a first side of the first portion of the stack of MTJ layers; and
a second metal re-deposition layer disposed directly on a second side of the second portion of the stack of MTJ layers, the first side of the first portion of the stack of MTJ layers and the second side of the second portion of the stack of MTJ layers facing the same direction, wherein the second metal re-deposition layer is electrically isolated from the first metal re-deposition layer, and
wherein the stack of MTJ layers includes a first electrode layer and a second electrode layer, and wherein the first metal re-deposition layer is disposed directly on the first electrode layer and wherein the second metal re-deposition layer is disposed directly on the second electrode layer.

10. The device of claim 9, further comprising a metal contact disposed directly on the stack of MTJ layers and the second metal re-deposition layer.

11. The device of claim 9, further comprising:
a first dielectric layer disposed directly on the first metal re-deposition layer and the second metal re-deposition layer; and
a second dielectric layer disposed directly on the first metal re-deposition layer without being disposed directly on the second metal re-deposition layer.

12. The device of claim 11, further comprising a spacer feature disposed between the first dielectric layer and the second dielectric layer such that the spacer feature interfaces with both the first dielectric layer and the second dielectric layer.

13. The device of claim 12, wherein the spacer feature includes an aluminum containing material.

14. The device of claim 12, wherein neither of the first and second metal re-deposition layers interface with the spacer feature.

15. A device comprising:
a first electrode;
a pinned layer on the first electrode, the pinned layer having a first width;
a barrier layer on the pinned layer, the barrier layer having a second width,
a first metal re-deposition layer on sidewalls of at least one of the barrier layer or the pinned layer,
a free layer on the barrier layer, the free layer having a third width, the third width being different than at least one of the first width or the second width;
a second electrode on the free layer;
a second metal re-deposition layer on sidewalls of at least one of the free layer or the second electrode; and
a first dielectric layer disposed between the first and second metal re-deposition layers thereby electrically isolating from the first metal re-deposition layer from the second metal re-deposition layer, wherein the first metal re-deposition layer has a first sidewall surface and the second metal re-deposition layer has a second sidewall surface that faces the first sidewall surface, and wherein the first dielectric layer physically contacts the first sidewall of the first metal re-deposition layer and the second sidewall of the second metal re-deposition layer.

16. The device of claim 15, wherein the first metal re-deposition layer is on sidewalls of both the barrier layer and the pinned layer, and wherein the second metal re-deposition layer is on sidewalls of both the free layer and the second electrode layer.

17. The device of claim 15, wherein the first and second widths are greater than the third width.

18. The device of claim 15, wherein the second metal re-deposition layer physically contacts the sidewall of the second electrode.

19. The device of claim 15, further comprising a spacer feature disposed on and interfacing with the first dielectric layer, the spacer feature including a material selected from the group consisting of a carbon containing material and an aluminum containing material.

20. The device of claim 19, further comprising a second dielectric layer disposed on and interfacing with the first metal re-deposition, the first dielectric layer and the spacer feature.

* * * * *